(12) United States Patent
Fujiwara

(10) Patent No.: US 12,172,681 B2
(45) Date of Patent: Dec. 24, 2024

(54) TRAVELING VEHICLE SYSTEM

(71) Applicant: MURATA MACHINERY, LTD., Kyoto (JP)

(72) Inventor: Hidetoshi Fujiwara, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 672 days.

(21) Appl. No.: 17/437,074

(22) PCT Filed: Feb. 18, 2020

(86) PCT No.: PCT/JP2020/006371
§ 371 (c)(1),
(2) Date: Sep. 8, 2021

(87) PCT Pub. No.: WO2020/202856
PCT Pub. Date: Oct. 8, 2020

(65) Prior Publication Data
US 2022/0161833 A1    May 26, 2022

(30) Foreign Application Priority Data

Apr. 3, 2019    (JP) .................... 2019-071206

(51) Int. Cl.
*B61B 13/12* (2006.01)
*B61B 3/02* (2006.01)
*H01L 21/677* (2006.01)

(52) U.S. Cl.
CPC .............. *B61B 13/12* (2013.01); *B61B 3/02* (2013.01); *H01L 21/67733* (2013.01); *H01L 21/6773* (2013.01)

(58) Field of Classification Search
CPC . H01L 21/67; H01L 21/677; H01L 21/67706; H01L 21/67703; H01L 21/67709; H01L 21/67028; H01L 21/67733; H01L 21/67742; H01L 21/67748; H01L 21/67763; B61B 3/00; B61B 3/02; B61B 13/12; B61B 13/127; E01B 25/34; E01B 25/30; B08B 5/04
USPC ................... 104/139, 130.02, 130.03
See application file for complete search history.

(56) References Cited

U.S. PATENT DOCUMENTS

| 2003/0042114 | A1* | 3/2003 | Iizuka | ............ B61C 13/04 |
| | | | | 198/570 |
| 2005/0071556 | A1 | 3/2005 | Walton et al. | |
| 2020/0075375 | A1* | 3/2020 | Li | ............ H01L 21/67028 |

FOREIGN PATENT DOCUMENTS

| JP | 2007-050793 A | 3/2007 |
| JP | 2007-314713 A | 12/2007 |
| JP | 2018-118809 A | 8/2018 |

* cited by examiner

*Primary Examiner* — Zachary L Kuhfuss
*Assistant Examiner* — Heaven R Buffington
(74) *Attorney, Agent, or Firm* — Keating & Bennett, LLP

(57) ABSTRACT

A traveling vehicle system in which a traveling vehicle travels along a traveling track including a rail body to accommodate a traveling unit of the traveling vehicle and extending along a traveling path of the traveling vehicle and a power feeder positioned along an extending direction of the rail body to supply electricity to the traveling unit, includes a working track that is continuous with the traveling track and includes an opening exposing at least a portion of the traveling unit and does not have the power feeder, and a mover to move the traveling vehicle along the working track.

13 Claims, 9 Drawing Sheets

TRAVELING VEHICLE SYSTEM

BACKGROUND OF THE INVENTION

1. Field of the Invention

An aspect of the present invention relates to a traveling vehicle system.

2. Description of the Related Art

An overhead traveling vehicle is known, which includes a body configured to travel along a track and an elevator including a gripper to grip an article and configured to ascend and descend with respect to the body by reeling and unreeling a plurality of suspension members (for example, Japanese Unexamined Patent Publication No. 2007-50793). The traveling vehicle described in Japanese Unexamined Patent Publication No. 2007-50793 travels along a track having a pair of left and right side walls and a base connecting the upper ends of the pair of side walls. The track is formed in a C shape in cross section such that a space accommodating a traveling unit is formed. The pair of side walls are each provided with a power feeder along the extending direction for supplying electricity to the traveling vehicle.

SUMMARY OF THE INVENTION

In such a traveling vehicle, maintenance including cleaning of the traveling unit needs to be performed periodically. Unfortunately, since the conventional track is formed such that the traveling unit travels inside the accommodation space, the maintenance is unable to be performed unless the traveling unit is exposed. An opening may be provided in the sidewall, but the sidewall has the power feeder and therefore does not provide a space for an opening having a size that enables maintenance of the traveling unit. If an opening having a size that enables maintenance is provided, the power feeder is unable to be provided and consequently, the traveling vehicle is unable to travel.

Preferred embodiments of the present invention provide traveling vehicle systems in each of which a working area is provided to expose a traveling unit requiring a maintenance operation and the traveling vehicle can be moved in the working area.

A traveling vehicle system according to an aspect of a preferred embodiment of the present invention is a traveling vehicle system in which a traveling vehicle travels along a traveling track including a body to accommodate a traveling unit of the traveling vehicle and extending along a traveling path of the traveling vehicle and a power feeder located along an extending direction of the body to supply electricity to the traveling unit. The traveling vehicle system includes a working track that is continuous with the traveling track and includes an opening exposing at least a portion of the traveling unit and does not have the power feeder, and a mover to move the traveling vehicle along the working track.

In the traveling vehicle system with this configuration, instead of providing the power feeder at the working track, the opening exposing at least a portion of the traveling unit uses a portion otherwise provided with the power feeder. In this configuration, maintenance of the traveling unit can be easily performed since the traveling unit accommodated in the body and unable to be exposed in the traveling track can be exposed from the track. Furthermore, in the traveling vehicle system with this configuration, although the traveling vehicle is unable to run by itself on the working track having no power feeder, the mover is provided in this working track. As a result, a working area exposing the traveling unit requiring a maintenance operation is provided, and the traveling vehicle can be moved in the working area.

In a traveling vehicle system according to an aspect of a preferred embodiment of the present invention, the traveling track may be connected to both ends of the working track, and the mover may move the traveling vehicle from the traveling track to another traveling track. In the traveling vehicle system with this configuration, the working area for maintenance of the traveling vehicle can be provided in a portion of the traveling path.

A traveling vehicle system according to an aspect of a preferred embodiment of the present invention may further include a processor to perform an operation on at least a portion of the traveling unit through the opening for the traveling vehicle on the working track. In the traveling vehicle system with this configuration, a maintenance operation for the traveling vehicle can be partially automated.

In a traveling vehicle system according to an aspect of a preferred embodiment of the present invention, the processor may include a suction device to suck substances that adhere to at least a portion of the traveling unit. In the traveling vehicle system with this configuration, adhering substances can be collected without causing the adhering substances to adhere to other portions.

In a traveling vehicle system according to an aspect of a preferred embodiment of the present invention, the mover may include a pair of arms to sandwich the traveling vehicle from front and rear in a traveling direction, a rotation driver to move the pair of arms between a position where the pair of arms sandwich the traveling vehicle and a position where the pair of arms retreat from the traveling vehicle, and a movement driver to move the pair of arms in an extending direction of the traveling track. In the traveling vehicle system with this configuration, since the traveling vehicle can be moved in a state in which the traveling vehicle is sandwiched from the front and the rear in the traveling direction, the traveling vehicle can be prevented from moving inertially when the traveling vehicle is moved or stopped.

In a traveling vehicle system according to an aspect of a preferred embodiment of the present invention, the mover may include a base plate and a moving plate at the base plate to be movable in the traveling direction. The pair of arms may include a first arm and a second arm. The first arm may be movable in the extending direction of the traveling track with respect to the moving plate. The second arm may be unmovable in the extending direction of the traveling track with respect to the moving plate. In the traveling vehicle system with this configuration, since the moving plate including the first arm and the second arm is moved when the traveling vehicle is to be moved, there is no need to perform synchronous control of the first arm and the second arm to maintain a certain distance between the first arm and the second arm. Thus, compared with a configuration in which the first arm and the second arm move independently of each other, the traveling vehicle can be moved under easy control.

In a traveling vehicle system according to an aspect of a preferred embodiment of the present invention, the traveling unit may include a running wheel to be braked at a time of no power feed and a running auxiliary wheel to rotate freely. The working track may include a lower support portion to support the traveling unit from below. The lower support portion may include a first portion facing the running auxiliary wheel and positioned above a second portion facing the running wheel, in a vertical direction. The running wheel in the traveling vehicle with this configuration does not rotate easily in a state in which the driver is not actuated. Thus, it is difficult to move the traveling vehicle in a state in which the running wheel is in contact with the working track having no power feeder. In the traveling vehicle system with this configuration, since only the running auxiliary wheel rotatable freely comes into contact with the working track, the traveling vehicle can be moved easily.

According to aspects of preferred embodiments of the present invention, a working area is provided to expose the traveling unit requiring a maintenance operation, and the traveling vehicle can be moved in the working area.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 2:
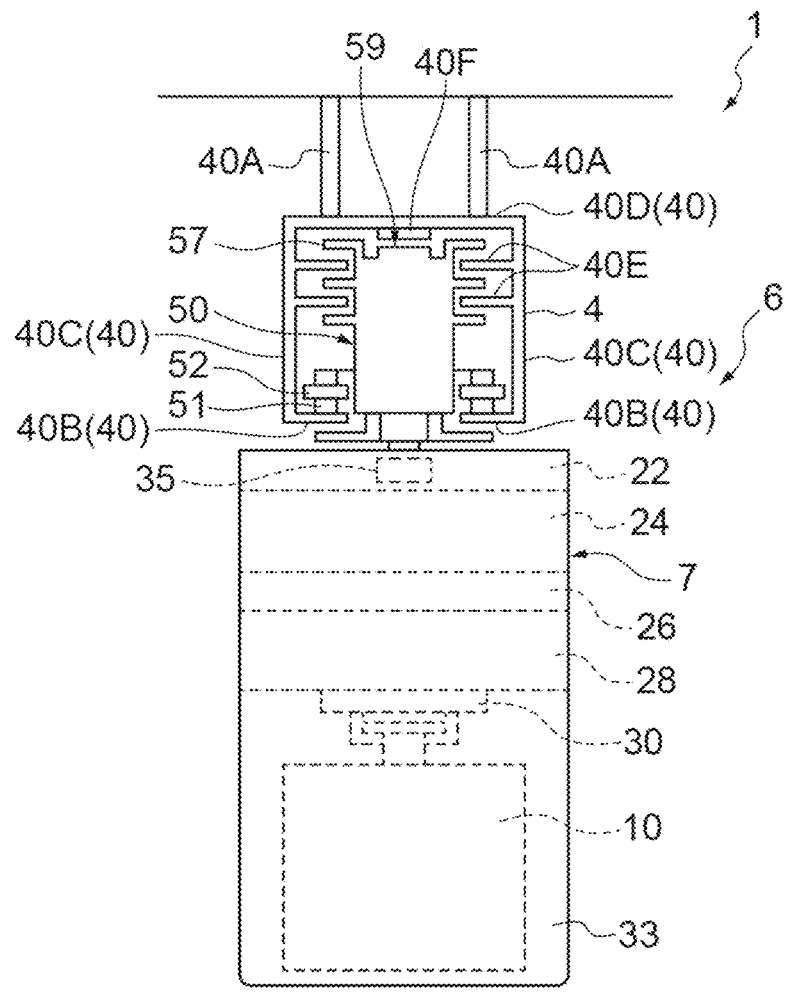
FIG. 2 is a schematic front view of an overhead traveling vehicle in FIG. 1 as viewed from the traveling direction.
Figure 4:
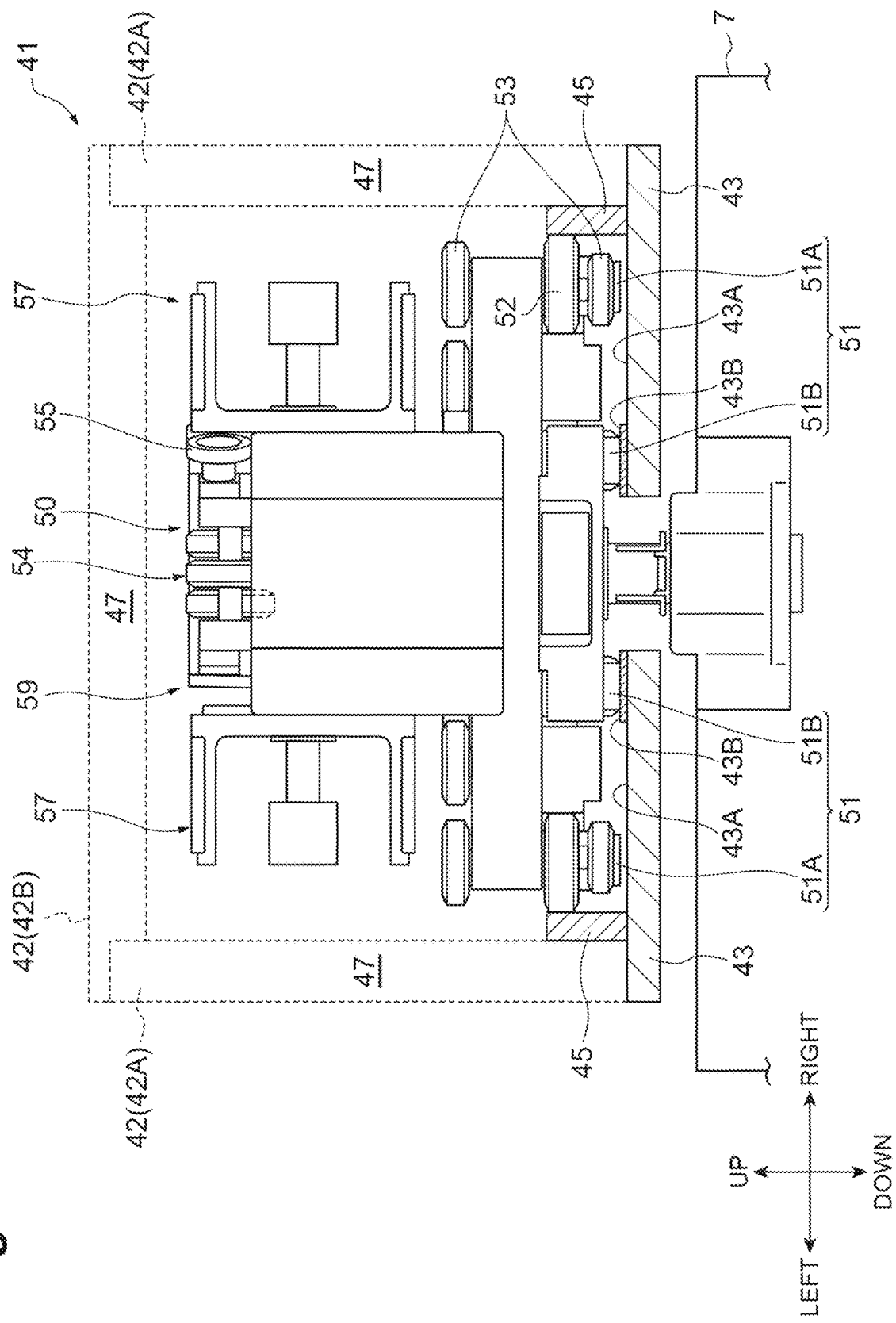
FIG. 4 is a cross-sectional view illustrating the working track in FIG. 3 and a traveling unit of the traveling vehicle.
Figure 7:
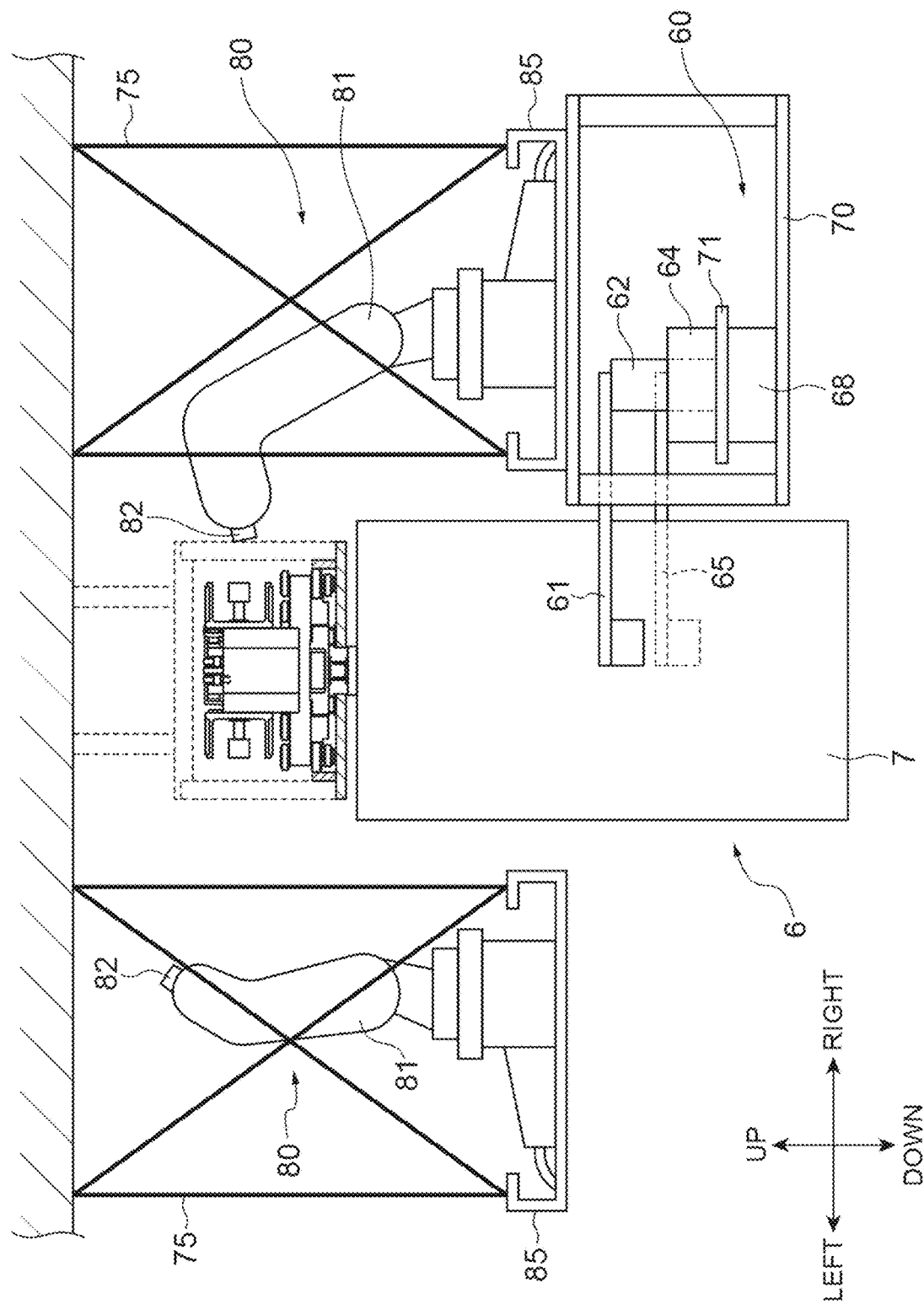
FIG. 7 is a cross-sectional view of the moving mechanism and a suction device disposed in a working area according to a preferred embodiment of the present invention as viewed from the extending direction of the working track.

Preferred embodiments according to aspects of the present invention will be described in detail below with reference to the drawings. In the description of the drawings, the same elements are denoted by the same reference signs and an overlapping description is omitted. In FIG. 2, FIG. 4, and FIG. 7, "up", "down", "left", "right", "front", and "rear" directions are defined for convenience of explanation.

Figure 1:
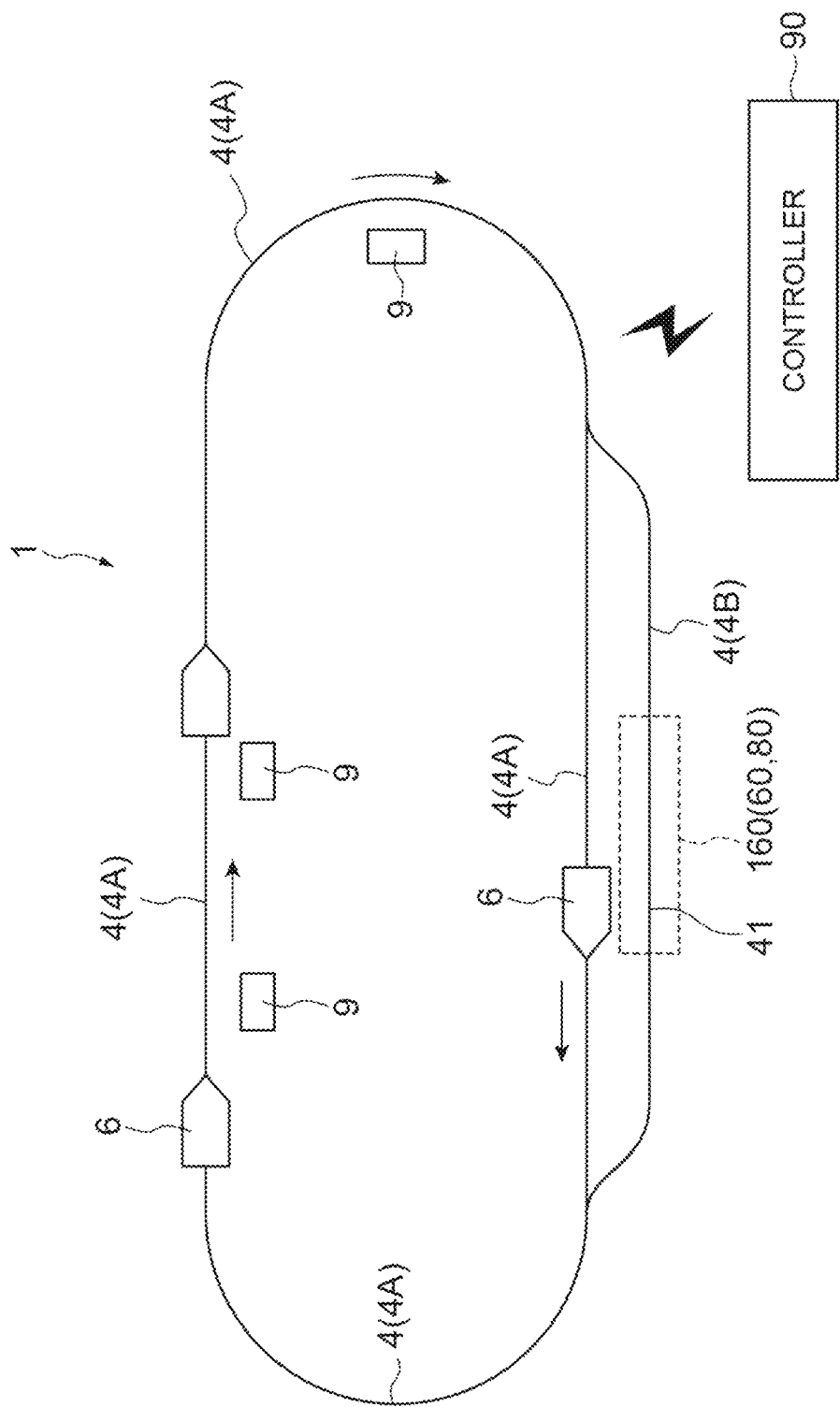
FIG. 1 is a schematic plan view illustrating a traveling vehicle system according to a preferred embodiment of the present invention.

As illustrated in FIG. 1 and FIG. 2, a traveling vehicle system 1 is a system for transporting an article 10 between placement sections 9 and 9 using an overhead traveling vehicle 6 movable along a traveling track 4. Examples of the article 10 include a front opening unified pod (FOUP) storing a plurality of semiconductor wafers and a container storing a glass substrate, a container such as a reticle pod, and common parts. The traveling vehicle system 1 includes the traveling track 4, a plurality of traveling vehicles 6, a plurality of placement sections 9, a working track 41, a moving mechanism 60, and a suction device (processing device) 80.

The traveling track 4 is laid, for example, in the vicinity of a ceiling that is a space above the worker's head. The traveling track 4 is, for example, suspended from the ceiling. The traveling track 4 is a predetermined traveling path for the traveling vehicles 6 to travel. The traveling track 4 is supported by struts 40A and 40A. The traveling track 4 of the traveling vehicle system 1 includes a main line 4A extending around a predetermined area in one direction and a retreat section 4B to guide the traveling vehicle 6 to the working track 41 having a working area 160 for maintenance of the traveling vehicle 6. In the retreat section 4B, the traveling vehicle 6 also moves in the predetermined one direction.

The traveling track 4 includes a tubular rail body 40 including a pair of lower surface portions 40B, a pair of side surface portions 40C and 40C, and a top surface portion 40D, a power feeder 40E, and a magnetic plate 40F. The rail body 40 accommodates (contains) a traveling unit 50 of the traveling vehicle 6. The lower surface portions 40B extend in the traveling direction of the traveling vehicle 6 and define a lower surface of the rail body 40. The lower surface portions 40B are plates to allow traveling rollers 51 of the traveling vehicle 6 to roll and travel. The side surface portions 40C extend in the traveling direction of the traveling vehicle 6 and define a side surface of the rail body 40. The top surface portion 40D extends in the traveling direction of the traveling vehicle 6 and defines an upper surface of the rail body 40.

The power feeder 40E supplies electricity to power feed cores 57 of the traveling vehicle 6 and transmits/receives a signal to/from the power feed cores 57. The power feeder 40E is fixed to each of a pair of side surface portions 40C and 40C and extends along the traveling direction. The power feeder 40E supplies electricity to the power feed core 57 in a contactless manner. The magnetic plate 40F produces magnetic force for travel or stop for linear DC motors (LDMs) 59 of the traveling vehicle 6. The magnetic plate 40F is fixed to the top surface portion 40D and extends along the traveling direction.

The traveling vehicle 6 travels the traveling track 4 and transports the article 10. The wording "the traveling vehicle 6 travels the traveling track 4" means that the traveling rollers 51 of the traveling vehicle 6 roll on the lower surface portions 40B of the traveling track 4. The traveling vehicle 6 is configured to transfer the article 10. The traveling vehicle 6 preferably is an automated overhead traveling vehicle, for example. The number of traveling vehicles 6 included in the traveling vehicle system 1 is not limited and is more than one. The traveling vehicle 6 includes a body 7, the traveling unit 50, and a control unit 35. The body 7 includes a body frame 22, a traverse unit 24, a θ drive 26, an elevation driver 28, an elevation stage 30, and covers 33.

The body frame 22 is connected to the traveling unit 50 and supports the traverse unit 24, the θ drive 26, the elevation driver 28, the elevation stage 30, and the covers 33. The traverse unit 24 allows the θ drive 26, the elevation driver 28, and the elevation stage 30 to collectively traverse in a direction normal to the traveling direction of the traveling track 4. The θ drive 26 turns at least one of the elevation driver 28 and the elevation stage 30 within a predetermined angle range in a horizontal plane. The elevation driver 28 elevates and lowers the elevation stage 30 by reeling or unreeling a suspension such as a wire, a rope, and a belt. The elevation stage 30 includes a chuck and can grip or release the article 10. A pair of covers 33 are provided, for example, at the front and the rear in the traveling direction of the traveling vehicle 6. The covers 33 produce a not-illustrated pawl and prevent the article 10 from dropping during transportation.

The traveling unit 50 allows the traveling vehicle 6 to travel along the traveling track 4. As illustrated in FIG. 4, the traveling unit 50 includes the traveling rollers 51, side rollers 52, branching rollers 53, auxiliary rollers 54, slanted rollers 55, power feed cores 57, and the LDMs 59. In FIG. 2, the branching rollers 53, the auxiliary rollers 54, and the slanted rollers 55 are not illustrated.

The traveling rollers 51 each include a roller pair including an outer wheel 51A as a running wheel and an inner wheel 51B as a traveling auxiliary ring. The traveling rollers 51 are disposed on the left and right ends at the rear and the front of the traveling unit 50. The traveling rollers 51 roll on a pair of lower surface portions 40B and 40B of the traveling track 4 (or lower support portions 43 in FIG. 4 described later). The side rollers 52 are disposed to sandwich each of the outer wheels 51A of the traveling rollers 51 in the front-rear direction. The side rollers 52 can come into contact with the side surface portions 40C of the traveling track 4 (or side support portions 45 in FIG. described later). The branching rollers 53 are disposed to sandwich each of the side rollers 52 in the up-down direction. The side rollers 52 can come into contact with a guide (not illustrated) disposed at a connection section or a branching section of the traveling track 4.

The auxiliary rollers 54 are roller groups, each including a set of three rollers, provided at the front and the rear of the traveling unit 50. The auxiliary rollers 54 are provided in order to prevent the LDMs 59, the power feed cores 57, and the like from coming into contact with the magnetic plate 40F disposed on the upper surface of the traveling track 4 when the traveling unit 50 is inclined to the front and rear during traveling, for example, due to acceleration/deceleration. The slanted rollers 55 are provided at four corners of the LDM 59. The slanted rollers 55 are slanted relative to the front-rear direction. The slanted rollers 55 are provided in order to prevent inclination due to centrifugal force that occurs when the traveling unit 50 travels a curve section.

The power feed cores 57 are disposed at the front and the rear of the traveling unit 50 so as to sandwich the LDM 59 in the left-right direction. Contactless power feeding and contactless transmission/reception of a variety of signals are performed between the power feed cores 57 and the power feeder 40E disposed at the traveling track 4. The power feed cores 57 exchange a signal with the control unit 35. The LDMs 59 are provided at the front and the rear of the traveling unit 50. The LDM 59 uses an electromagnet to produce magnetic force for traveling or stopping between the LDM 59 and the magnetic plate 40F disposed on the upper surface of the traveling track 4.

As illustrated in FIG. 1, the placement sections 9 are arranged along the traveling track 4 and provided at positions where the article 10 can be delivered to/from the traveling vehicle 6. The placement sections 9 include a buffer and a delivery port. The buffer is a placement section on which the article 10 is temporarily placed. The buffer is a placement section on which the article 10 is temporarily placed when the article 10 transported by the traveling vehicle 6 is unable to be transferred to a target delivery port, for example, for the reason that another article 10 is placed on the target delivery port. The delivery port is, for example, a placement section to deliver the article 10 to a semiconductor processing device (not illustrated) such as a cleaning device, a deposition device, a lithography device, an etching device, a thermal treatment device, and a planarization device. The processing device is not limited to a specific device and may be a variety of devices.

For example, the placement sections 9 are arranged to the side of the traveling track 4. In this case, the traveling vehicle 6 allows the traverse unit 24 to traverse the elevation driver 28 and the like and slightly elevates and lowers the elevation stage 30 to deliver the article 10 to/from the placement section 9. Although not illustrated, the placement sections 9 may be arranged immediately below the traveling track 4. In this case, the traveling vehicle 6 elevates and lowers the elevation stage 30 to deliver the article 10 to/from the placement section 9.

The control unit 35 is an electronic control unit including a central processing unit (CPU), a read only memory (ROM), and a random access memory (RAM). The control unit 35 is configured or programmed to control various operations in the traveling vehicle 6. Specifically, the control unit 35 controls the traveling unit 50, the traverse unit 24, the θ drive 26, the elevation driver 28, and the elevation stage 30. The control unit 35 can be configured, for example, as software of a computer program stored in the ROM, loaded into the RAM, and executed by the CPU. The control unit 35 may be configured as hardware with electronic circuitry, for example. The control unit 35 communicates with a controller 90 using the power feeder 40E (feeder line) of the traveling track 4.

The controller 90 is an electronic control unit including a CPU, a ROM, and a RAM. The controller 90 can be configured, for example, as software of a computer program stored in the ROM, loaded into the RAM, and executed by the CPU. The controller 90 may be configured as hardware with electronic circuitry, for example. The controller 90 transmits a transportation command to transport the article 10 to the traveling vehicle 6.

As illustrated in FIG. 1, the working area 160 is an area provided in a part of the retreat section 4B and in which maintenance of the traveling rollers 51, the power feed cores 57, and the like of the traveling unit 50 included in the traveling vehicle 6 is performed. In the working area 160, the working track (see FIG. 3), the moving mechanism 60 (see FIG. 5 and FIG. 6), and the suction device (processing device) 80 (see FIG. 7) are provided.

Figure 3:
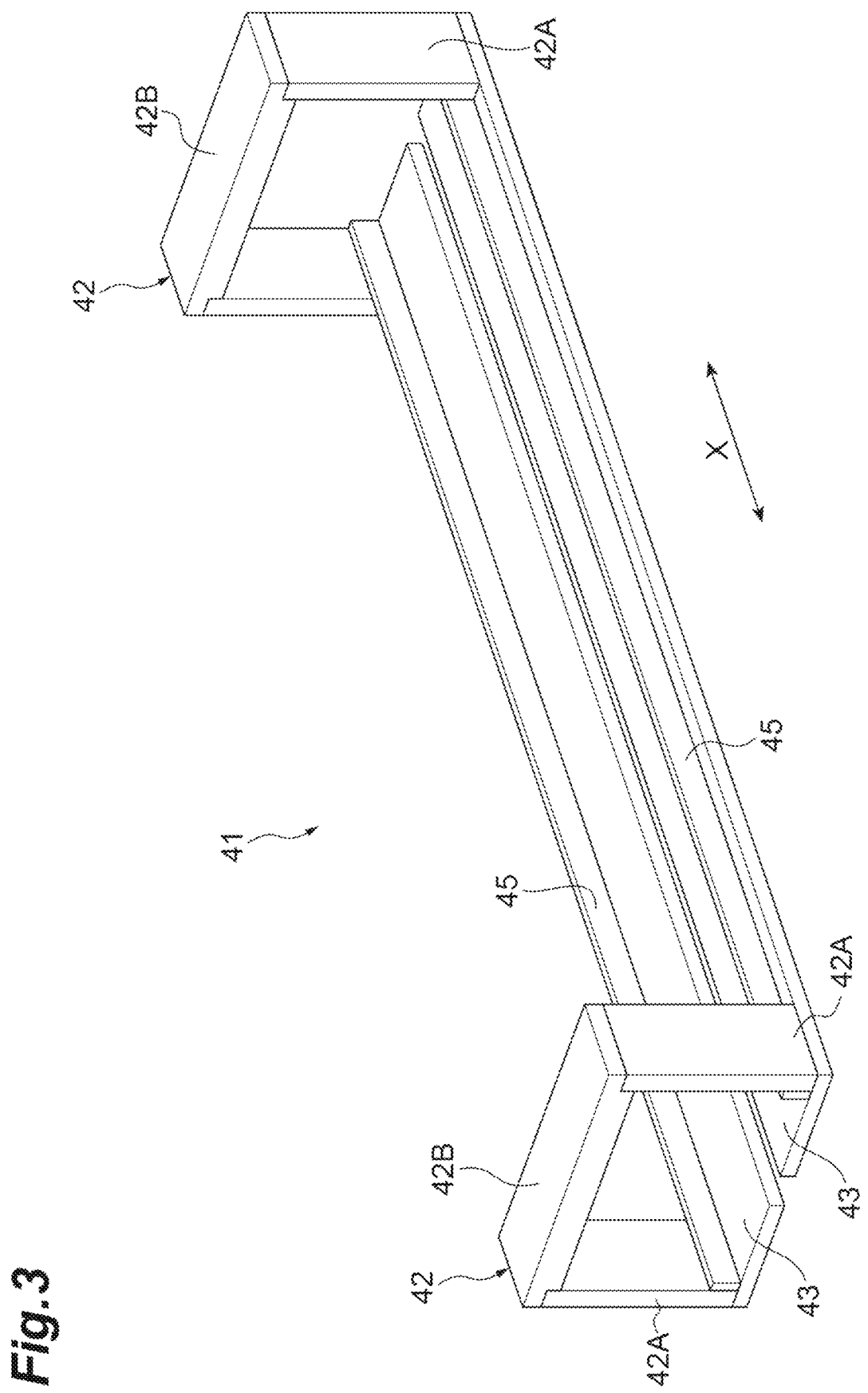
FIG. 3 is a perspective view illustrating a working track according to a preferred embodiment of the present invention.

The working track 41 extends in one direction (hereinafter referred to as "extending direction X") such that both ends thereof are continuous to the traveling tracks 4 and 4 and, as illustrated in FIG. 3 and FIG. 4, defines an opening 47 to expose at least a portion (for example, power feed cores 57) of the traveling unit 50. In other words, unlike the traveling track 4, the working track 41 does not have the power feeder 40E or the top surface portion 40D, and the portion corresponding to the power feeder 40E and the top surface portion 40D of the traveling track 4 is the opening 47.

The working track 41 includes frames 42 disposed at both ends of the working track 41, a pair of lower support portions 43 and 43, and a pair of side support portions 45.

The frames 42 each include a pair of side surface portions 42A and 42A and a top surface portion 42B. A pair of side surface portions 42A and 42A are plates disposed to face each other in the left-right direction and extending in the vertical direction. The side surface portions 42A are fixed to a ceiling with a bracket (not illustrated) and a strut (not illustrated) interposed. The top surface portion 42B is a plate connecting a pair of side surface portions 42A and 42A at the upper ends of a pair of side surface portions 42A and 42A.

The lower support portions 43 support the traveling unit 50 from below. More specifically, the lower support portions 43 allow the inner wheels 51B of the traveling rollers 51 of the traveling vehicle 6 to roll and travel. The lower support portions 43 are fixed to the lower ends of the side surface portions 42A of the frame 42 and stretched between a pair of frames 42 and 42 along the extending direction X. The lower support portion 43 is located such that a first portion 43B facing the inner wheel 51B is positioned above a second portion 43A facing the outer wheel 51A, in the vertical direction. The first portion 43B of the lower support portion 43 (that is, the rolling surface for the inner wheel 51B) defines a plane on the same level as (is flush with) the upper surface of the lower surface portion 40B (see FIG. 2) of the traveling track 4, at a portion connected to the traveling track 4.

The side support portions 45 are in contact with the side rollers 52 of the traveling vehicle 6. The side support portions 45 are fixed to the side surface portions 42A of the frames 42 and stretched between a pair of frames 42 and 42.

Figure 5:
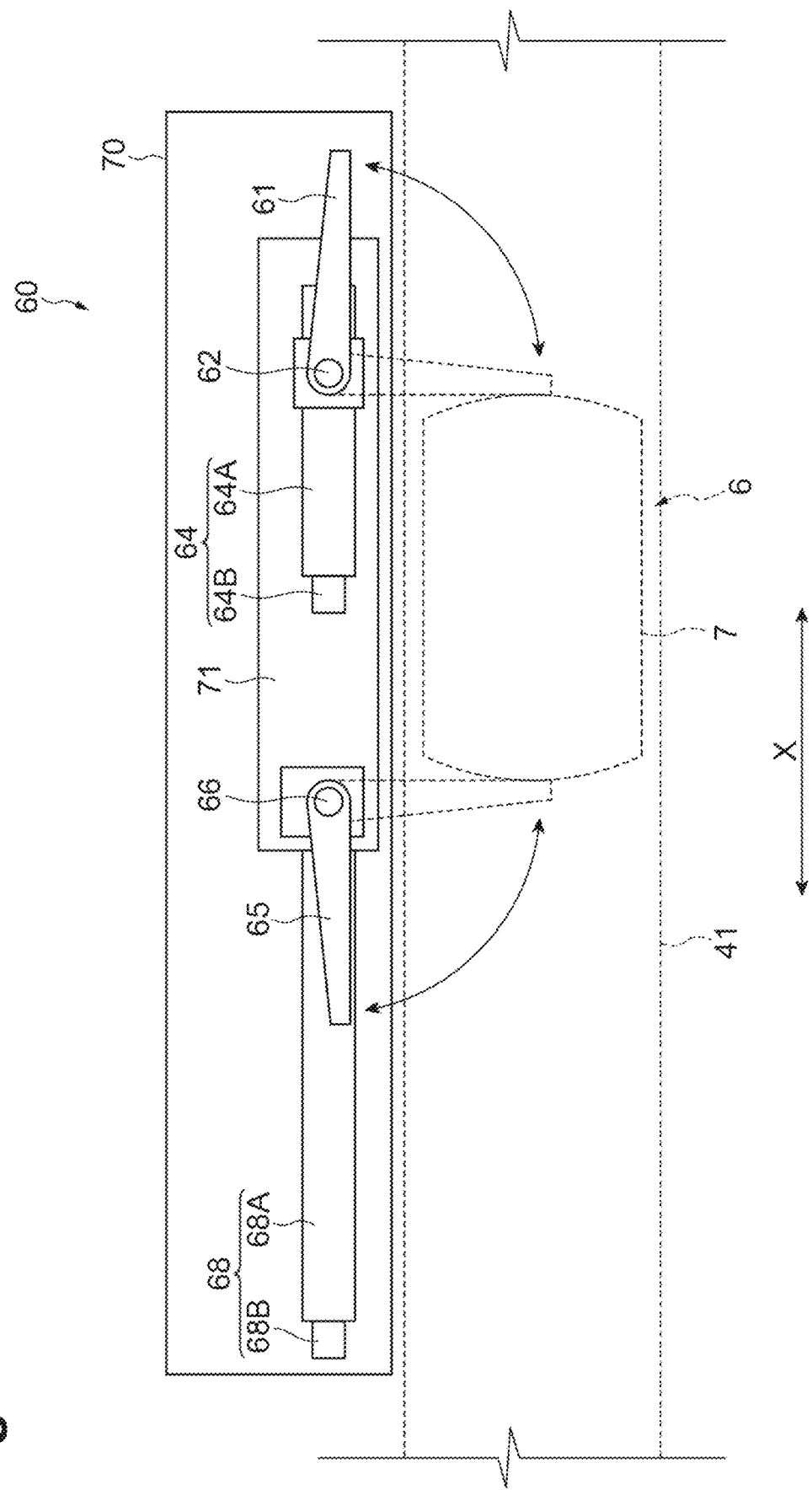
FIG. 5 is a plan view illustrating a moving mechanism according to a preferred embodiment of the present invention.
Figure 6:
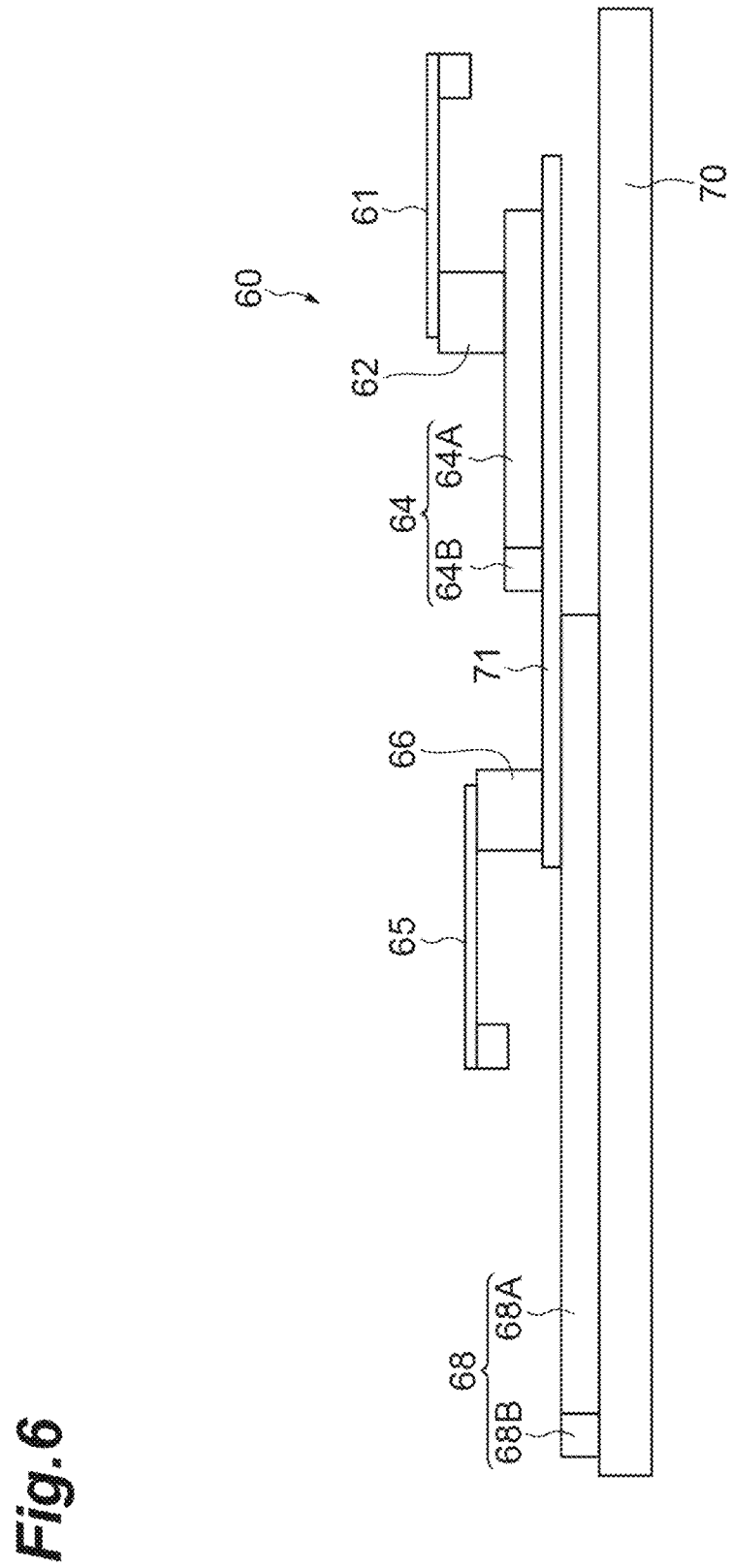
FIG. 6 is a side view illustrating the moving mechanism in FIG. 5.

As illustrated in FIG. 5 to FIG. 7, the moving mechanism 60 moves the traveling vehicle 6 along the working track 41 such that the traveling vehicle 6 travels the working track 41. The wording "the traveling vehicle 6 travels the working track 41" means that the traveling rollers 51 of the traveling vehicle 6 roll on the lower support portions 43 of the working track 41. The traveling tracks 4 and 4 are connected to both ends of the working track 41. The moving mechanism 60 moves the traveling vehicle 6 from one of the traveling tracks 4 to the other traveling track 4. The moving mechanism 60 includes a base plate 70, a moving plate 71, a pair of arms including a first arm 61 and a second arm 65, a first rotation driver (rotation driver) 62, a second rotation driver (rotation driver) 66, a first movement driver (movement driver) 64, and a second movement driver (movement driver) 68.

The base plate 70 is a plate supporting the moving plate 71, the first arm 61, the second arm 65, the first rotation driver 62, the second rotation driver 66, the first movement driver 64, and the second movement driver 68. The base plate 70 is suspended from the ceiling by a suspension 75.

The moving plate 71 is a plate supporting the first arm 61, the second arm 65, the first rotation driver 62, the second rotation driver 66, the first movement driver 64, and the second movement driver 68. The moving plate 71 is movable in the extending direction X of the traveling vehicle 6 with respect to the base plate 70. More specifically, the moving plate 71 is movable by the second movement driver 68 including a linear motion guide (LM guide) 68A and a driving motor 68B in the extending direction X of the traveling vehicle 6 with respect to the base plate 70.

The first arm 61 is disposed on the upstream side in the extending direction X of the traveling vehicle 6. That is, the first arm 61 comes into contact with the rear end (cover 33) of the traveling vehicle 6 when the traveling vehicle 6 is to be moved. As used herein, the upstream side and the downstream side refer to a direction determined based on the moving direction in preset one direction of the traveling vehicle 6. The first arm 61 is moved by the first rotation driver 62 between a position where the first arm 61 sandwiches the traveling vehicle 6 (contact position) and a position where the first arm 61 retreats from the traveling vehicle (retreat position). The first arm 61 and the first rotation driver 62 are movable by the first movement driver 64 in the extending direction X of the traveling vehicle 6 with respect to the moving plate 71. More specifically, the first arm 61 and the first rotation driver 62 are movable by the first movement driver including an LM guide 64A and a driving motor 64B in the extending direction X of the traveling vehicle 6 with respect to the moving plate 71.

The second arm 65 is disposed on the downstream side in the extending direction X of the traveling vehicle 6. That is, the second arm 65 comes into contact with the front end of the traveling vehicle 6 when the traveling vehicle 6 is to be moved. The second arm 65 is moved by the second rotation driver 66 between a position where the second arm 65 sandwiches the traveling vehicle 6 and a position where the second arm 65 retreats from the traveling vehicle 6. Unlike the first arm 61 and the first rotation driver 62, the second arm 65 and the second rotation driver 66 are unmovable in the extending direction X with respect to the moving plate 71.

The suction device 80 performs operation on at least a portion of the traveling unit 50 through the opening 47 for the traveling vehicle 6 positioned in the working area 160 (working track 41). More specifically, the suction device 80 sucks adhering substances that adhere to at least a portion of (for example, the power feed core 57) of the traveling unit 50. The suction device 80 is provided at a support plate 85 suspended from the ceiling. The suction device 80 is a vertical articulated robot 81 having six (six-axis) joints and includes a suction unit 82 at its distal end for sucking adhering substances.

The operation of the moving mechanism 60 to move the traveling vehicle 6 will be described mainly with reference to FIGS. 8A to 8D and FIGS. 9A to 9D.

Figure 8A:
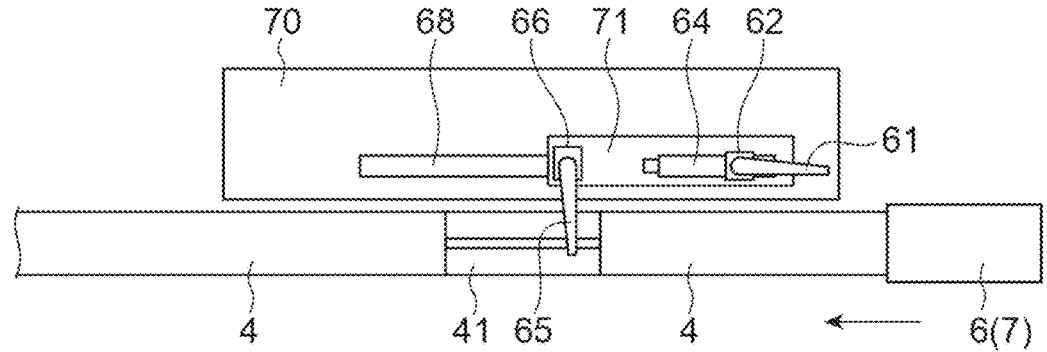
FIGS. 8A to 8D are diagrams illustrating operation of the moving mechanism in FIG. 5.
Figure 8B:
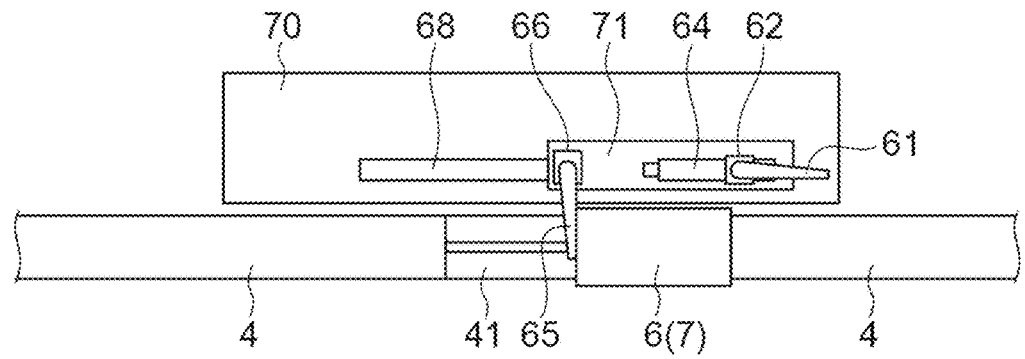
Figure 8C:
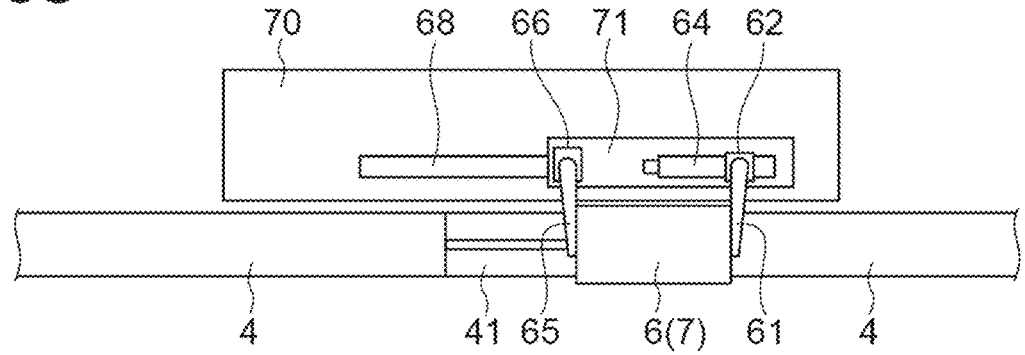

When the traveling vehicle 6 is not present on the working track 41 disposed in the working area 160, as illustrated in FIG. 8A, the first arm 61 is positioned at the retreat position and the second arm 65 is positioned at the contact position. In such a state, when the traveling vehicle 6 enters the working track 41, as illustrated in FIG. 8B, the traveling vehicle 6 temporarily stops at a position in contact with the second arm 65. When the traveling vehicle 6 temporarily stops at a position in contact with the second arm 65, the first rotation driver 62 rotates the first arm 61 into the contact position, and the first movement driver 64 advances the first arm 61 and the first rotation driver 62 (moves to the downstream side in the traveling direction of the traveling vehicle 6). As a result, as illustrated in FIG. 8C, the traveling vehicle 6 is sandwiched between the first arm 61 and the second arm 65.

Figure 8D:
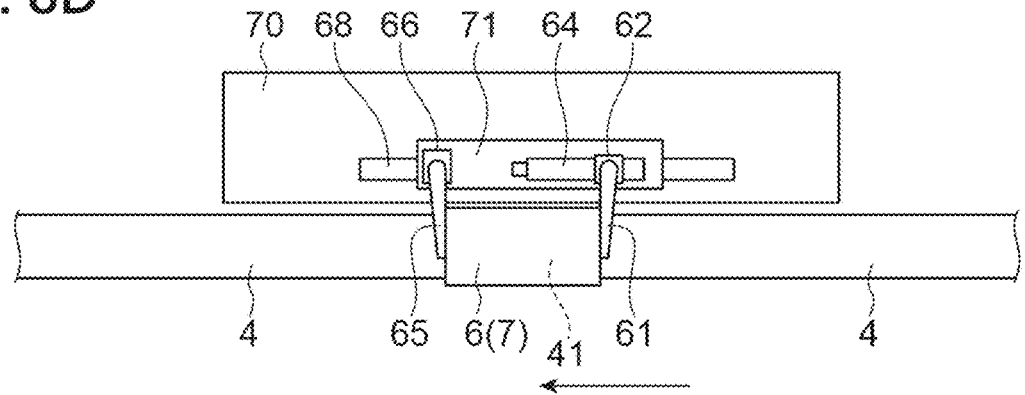
Figure 9A:
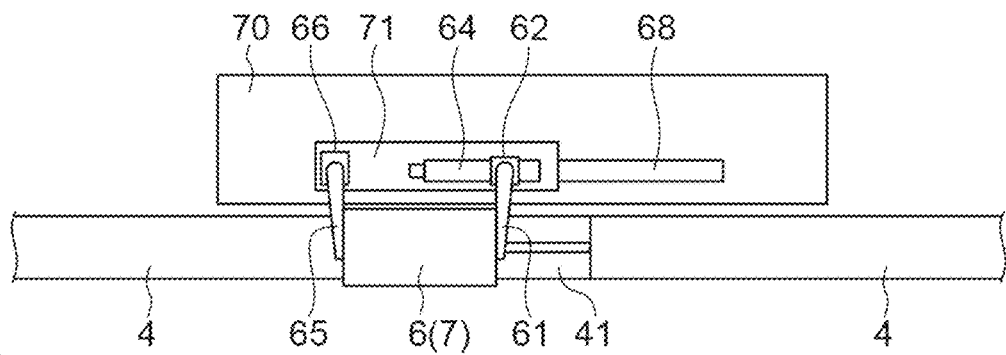
FIGS. 9A to 9D are diagrams illustrating operation of the moving mechanism in FIG. 5.

Subsequently, as illustrated in FIG. 8D, the second movement driver 68 advances the moving plate 71. That is, while keeping the distance between the first arm 61 and the second arm 65, the second movement driver 68 advances the first arm 61, the first rotation driver 62, the second arm 65, and the second rotation driver 66. The traveling vehicle 6, sandwiched between the first arm 61 and the second arm 65, is advanced and, as illustrated in FIG. 9A, moved from one traveling track 4 to the other traveling track 4 along the working track 41.

Figure 9B:
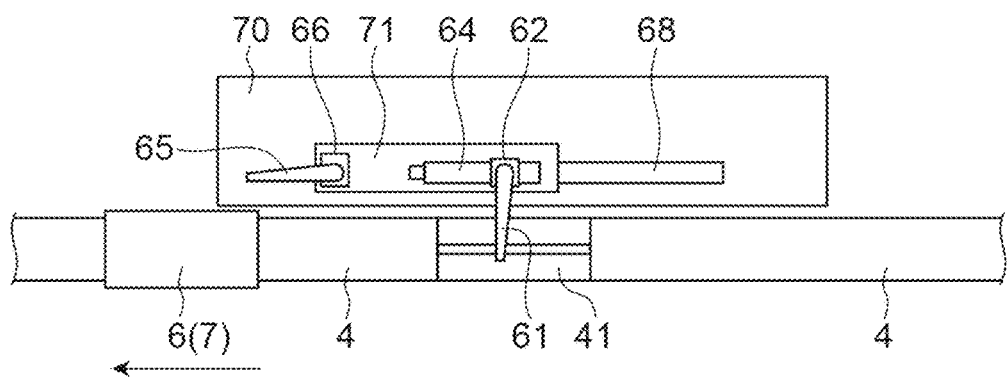

Subsequently, when the traveling vehicle 6 is moved to the other traveling track 4, as illustrated in FIG. 9B, the second rotation driver 66 rotates the second arm 65 to the retreat position. The traveling vehicle 6 thereafter starts being advanced by a driver of the traveling unit 50 of the traveling vehicle 6 itself by electricity supplied to the power feed cores 57 of the traveling unit 50.

Figure 9C:
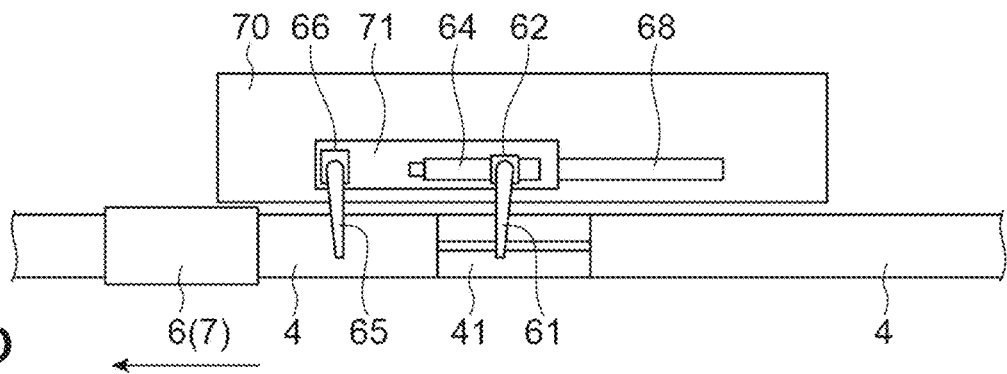
Figure 9D:
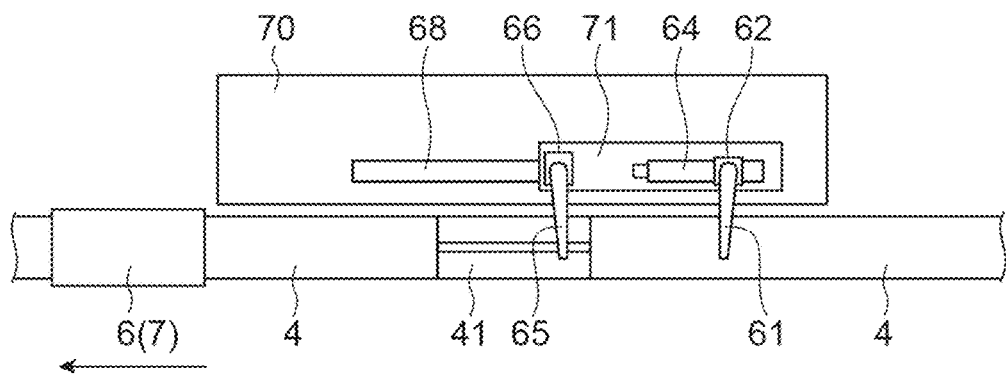

Subsequently, as illustrated in FIG. 9C, the second rotation driver 66 rotates the second arm 65 to the contact position. The second movement driver 68 then retreats the moving plate 71. That is, while keeping the distance between the first arm 61 and the second arm 65, the second movement driver 68 retreats the first arm 61, the first rotation driver 62, the second arm 65, and the second rotation driver 66. The first movement driver 64 thereafter retreats the first arm 61 and the first rotation driver 62. As illustrated in FIG. 9D, the first arm 61 and the second arm 65 return to a position where the traveling vehicle 6 entering subsequently is awaited. Then, as illustrated in FIG. 8A, arrival of the next traveling vehicle 6 is awaited with the first arm 61 positioned at the retreat position and the second arm 65 positioned at the contact position.

The operation effect of the traveling vehicle system 1 in the foregoing preferred embodiment will now be described. In the traveling vehicle system 1 in the foregoing preferred embodiment, instead of providing the power feeder in the working track 41, as illustrated in FIG. 3, the opening 47 exposing at least a portion of the traveling unit 50 of the traveling vehicle 6 uses a portion otherwise provided with the power feeder. Since the traveling unit 50 accommodated in the rail body 40 and not exposed in the traveling track 4 can be exposed from the working track 41, maintenance of the traveling unit 50 can be easily performed. Furthermore, in the traveling vehicle system 1 in the foregoing preferred embodiment, the moving mechanism 60 is provided to move the traveling vehicle 6, which does not have a power feeder and is unable to run by itself, in the working track 41. Thus, the working area 160 exposes the traveling unit 50 requiring a maintenance operation, and the traveling vehicle 6 can be moved in the working area 160.

As illustrated in FIG. 5 to FIG. 6, the traveling vehicle system 1 in the foregoing preferred embodiment includes the moving mechanism 60 to move the traveling vehicle 6 from one traveling track 4 to the other traveling track 4 along the working track 41. Thus, the working area for maintenance of the traveling vehicle 6 can be provided in a portion of the traveling path.

As illustrated in FIG. 7, the traveling vehicle system 1 in the foregoing preferred embodiment includes the suction device 80 defining and functioning as a processing device to perform an operation on at least a portion of the traveling unit 50 through the opening 47 for the traveling vehicle 6 positioned in the working track 41. With such a configuration, the maintenance operation for the traveling vehicle 6 can be partially automated, and adhering substances can be collected without scattering the adhering substances to cause the adhering substances to adhere to other portions.

As illustrated in FIG. 5 and FIG. 6, the moving mechanism 60 of the traveling vehicle system 1 in the foregoing preferred embodiment includes the first arm 61 and the second arm 65, which are a pair of arms to sandwich the traveling vehicle 6 from the front and the rear in the traveling direction. Such a configuration can prevent the traveling vehicle 6 from moving inertially when the traveling vehicle 6 is moved or stopped.

In the moving mechanism 60 of the traveling vehicle system 1 in the foregoing preferred embodiment, the first arm 61 and the second arm 65 are provided on the moving plate 71 to be movable in the extending direction X with respect to the base plate 70. With such a configuration, there is no need for performing synchronous control of the first arm 61 and the second arm 65 to keep the distance therebetween when the traveling vehicle 6 is moved. Thus, compared with a configuration in which the first arm 61 and the second arm 65 move independently of each other, the traveling vehicle 6 can be moved under easy control.

In the working track 41 of the traveling vehicle system 1 in the foregoing preferred embodiment, as illustrated in FIG. 4, the lower support portion 43 is located such that the first portion 43B facing the inner wheel 51B is positioned above the second portion 43A facing the outer wheel 51A, in the vertical direction. Thus, even in the traveling vehicle 6 having the outer wheel 51A that is braked so as not to rotate in a state in which electricity is not supplied to the power feed core 57 (at the time of no power feed), only the inner wheel 51B that is not braked and rotates freely comes into contact with the working track 41, and the outer wheel 51A that is a running wheel is floated (not in contact with the lower support portion 43), so that the traveling vehicle 6 can be easily moved.

Although preferred embodiments of the present invention have been described above, preferred embodiments of the present invention are not limited to the foregoing preferred embodiments and may be modified or combined without departing from the spirit of the invention.

The working track 41 in the foregoing preferred embodiments includes the lower support portions 43 and the side support portions 45. However, the present invention is not limited thereto. For example, the working track 41 may include side surface portions that cover the side surfaces, like a pair of side surface portions 40C and 40C in the traveling track 4, and the opening 47 exposing at least a portion of the traveling unit 50 may use a portion otherwise provided with the power feeder.

In the foregoing preferred embodiments, the working area 160 (that is, working track 41) is disposed between the traveling tracks 4. However, the working area 160 may be disposed at a terminal end of the traveling track 4.

In the moving mechanism 60 in the foregoing preferred embodiments, the first arm 61 and the second arm 65 are provided on the moving plate 71 and move integrally in the extending direction X. However, the present invention is not limited to these preferred embodiments. For example, the first arm 61 and the second arm 65 may be provided on the base plate 70 and may be movable independently of each other in the extending direction X with respect to the base plate 70.

In the working track 41 in the foregoing preferred embodiments, the lower support portion 43 is located such that the first portion 43B is positioned above the second portion 43A in the vertical direction. However, the present invention is not limited to these preferred embodiments. For example, when the running wheel of the traveling unit 50 is the inner wheel 51B and the running auxiliary wheel is the outer wheel 51A, the second portion 43A may be above the first portion 43B.

The foregoing preferred embodiments are preferably applicable to the traveling track 4 to allow the traveling vehicle 6 to travel in a suspended manner. However, preferred embodiments of the present invention may be applied to a traveling vehicle system in which a traveling vehicle travels on a track disposed on the ground.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A traveling vehicle system in which a traveling vehicle travels along a traveling track including a body to accommodate a traveling unit of the traveling vehicle and extending along a traveling path of the traveling vehicle and a power feeder located along an extending direction of the body to supply electricity to the traveling unit, the traveling vehicle system comprising:

a working track that is continuous with the traveling track and includes an opening exposing at least a portion of the traveling unit and does not have the power feeder; and a mover to move the traveling vehicle along the working track; wherein the traveling unit includes a running wheel to be braked at a time of no power feed and a running auxiliary wheel to rotate freely;

the working track includes a lower support portion to support the traveling unit from below; and the lower support portion is located such that a first portion facing the running auxiliary wheel is positioned above a second portion facing the running wheel, in a vertical direction.

2. The traveling vehicle system according to claim 1, wherein the traveling track is connected to both ends of the working track; and the mover moves the traveling vehicle from the traveling track to another traveling track.

3. The traveling vehicle system according to claim 2, wherein the mover includes:

a pair of arms to sandwich the traveling vehicle from front and rear in a traveling direction;

a rotation driver to move the pair of arms between a position where the pair of arms sandwich the traveling vehicle and a position where the pair of arms retreat from the traveling vehicle; and a movement driver to move the pair of arms in an extending direction of the traveling track.

4. The traveling vehicle system according to claim 2, further comprising a processor to perform an operation on at least a portion of the traveling unit through the opening for the traveling vehicle positioned on the working track.

5. The traveling vehicle system according to claim 4, wherein the mover includes:

a pair of arms configured to sandwich the traveling vehicle from front and rear in a traveling direction, a rotation driver configured to move the pair of arms between a position where the pair of arms sandwich the traveling vehicle and a position where the pair of arms retreat from the traveling vehicle, and a movement driver configured to move the pair of arms in an extending direction of the traveling track.

6. The traveling vehicle system according to claim 4, wherein the processor includes a suction device to suck substances that adhere to at least a portion of the traveling unit.

7. The traveling vehicle system according to claim 6, wherein the mover includes:

a pair of arms to sandwich the traveling vehicle from front and rear in a traveling direction;

a rotation driver to move the pair of arms between a position where the pair of arms sandwich the traveling vehicle and a position where the pair of arms retreat from the traveling vehicle; and a movement driver to move the pair of arms in an extending direction of the traveling track.

8. The traveling vehicle system according to claim 1, further comprising a processor to perform an operation on at least a portion of the traveling unit through the opening for the traveling vehicle positioned on the working track.

9. The traveling vehicle system according to claim 8, wherein the mover includes:

a pair of arms to sandwich the traveling vehicle from front and rear in a traveling direction;

a rotation driver to move the pair of arms between a position where the pair of arms sandwich the traveling vehicle and a position where the pair of arms retreat from the traveling vehicle; and a movement driver to move the pair of arms in an extending direction of the traveling track.

10. The traveling vehicle system according to claim 8, wherein the processor includes a suction device to suck substances that adhere to at least a portion of the traveling unit.

11. The traveling vehicle system according to claim 10, wherein the mover includes:

a pair of arms to sandwich the traveling vehicle from front and rear in a traveling direction;

a rotation driver to move the pair of arms between a position where the pair of arms sandwich the traveling vehicle and a position where the pair of arms retreat from the traveling vehicle; and a movement driver to move the pair of arms in an extending direction of the traveling track.

12. A traveling vehicle system in which a traveling vehicle travels along a traveling track including a body to accommodate a traveling unit of the traveling vehicle and extending along a traveling path of the traveling vehicle and a power feeder located along an extending direction of the body to supply electricity to the traveling unit, the traveling vehicle system comprising:

a working track that is continuous with the traveling track and includes an opening exposing at least a portion of the traveling unit and does not have the power feeder; and a mover to move the traveling vehicle along the working track; wherein the mover includes:

a pair of arms to sandwich the traveling vehicle from front and rear in a traveling direction;

a rotation driver to move the pair of arms between a position where the pair of arms sandwich the traveling vehicle and a position where the pair of arms retreat from the traveling vehicle; and a movement driver to move the pair of arms in an extending direction of the traveling track.

13. The traveling vehicle system according to claim 12, wherein the mover includes a base plate and a moving plate at the base plate to be movable in the traveling direction;

the pair of arms includes a first arm and a second arm;

the first arm is movable in the extending direction of the traveling track with respect to the moving plate; and the second arm is unmovable in the extending direction of the traveling track with respect to the moving plate.

* * * * *